(12) United States Patent
Ryu (10) Patent No.: US 7,838,179 B2
(45) Date of Patent: Nov. 23, 2010

(54) METHOD FOR FABRICATING PHOTO MASK

(75) Inventor: Jin Ho Ryu, Seoul (KR)

(73) Assignee: Hynix Semiconductor Inc., Icheon-si (KR)

( * ) Notice: Subject to any disclaimer, the term of this patent is extended or adjusted under 35 U.S.C. 154(b) by 390 days.

(21) Appl. No.: 11/950,567

(22) Filed: Dec. 5, 2007

(65) Prior Publication Data
US 2008/0280214 A1  Nov. 13, 2008

(30) Foreign Application Priority Data
May 11, 2007  (KR) .................. 10-2007-0045798

(51) Int. Cl.
*G03F 1/00* (2006.01)
(52) U.S. Cl. .............. 430/5; 430/30; 430/312
(58) Field of Classification Search ............ 430/5, 430/22, 311–314, 322, 323, 394; 438/197, 438/737
See application file for complete search history.

(56) References Cited

U.S. PATENT DOCUMENTS 6,506,534 B1  1/2003  Nozaki et al.
2003/0068563 A1*  4/2003  Hong et al. .............. 430/5
2004/0081896 A1*  4/2004  Pierrat .............. 430/5
2006/0019174 A1*  1/2006  Ahn et al. .............. 430/5

FOREIGN PATENT DOCUMENTS

| KR | 10-2000-0044948 | 7/2000 |
| KR | 10-2002-0001232 | 1/2002 |
| KR | 10-2005-0063323 | 6/2005 |

* cited by examiner

*Primary Examiner*—Mark F Huff
*Assistant Examiner*—Stewart A Fraser
(74) *Attorney, Agent, or Firm*—Marshall, Gerstein & Borun LLP (57) ABSTRACT

In a method for fabricating a photo mask, first resist patterns are formed on a transparent substrate where a light blocking layer and a phase shift layer are formed. Line widths of the first resist patterns are measured to define a region requiring a line width correction. Second resist patterns exposing the defined region are formed on the first resist patterns. The line width of the light blocking layer is corrected by over-etching the exposed light blocking layer to a predetermined thickness. The second resist patterns are removed. Phase shift patterns and light blocking patterns are formed using the first resist patterns as an etch mask. Then, the first resist patterns are removed.

15 Claims, 7 Drawing Sheets

METHOD FOR FABRICATING PHOTO MASK

CROSS-REFERENCE TO RELATED APPLICATIONS

Priority to Korean patent application number 10-2007-0045798, filed on May 11, 2007, which is incorporated by reference in its entirety, is claimed.

BACKGROUND OF THE INVENTION

The invention relates to a method for fabricating a semiconductor device, and more particularly, to a method for fabricating a photo mask.

In fabrication of semiconductor devices, a photo mask on which patterns have been formed is used to form the patterns on a semiconductor substrate. The patterns formed on the photo mask are transferred onto the semiconductor substrate by a photolithography process. Thus, the quality of the photo mask is important.

To fabricate the photo mask, a light blocking layer and a resist layer are formed on a transparent substrate. Desired patterns are transferred onto the resist layer using an exposure apparatus. A development process using a developer is performed to form resist patterns. The light blocking layer is etched using the resist patterns as an etch mask to form light blocking patterns. Then, the resist patterns are removed.

Some of the resist patterns may have line widths larger than a desired critical dimension (CD) due to various factors during the process of fabricating the photo mask. The resist patterns are used as the etch mask to etch the light blocking layer. Therefore, if the resist patterns have a large line width, the light blocking patterns also have line widths larger than the desired critical dimension, thus degrading the uniformity of the pattern line width. The uniformity of the pattern line width is an important factor in determining the quality of the photo mask.

Accordingly, many attempts have been made to improve the quality of the photo mask by correcting the resist patterns having the large line width on the photo mask. As one example, after the line widths of the resist patterns formed on the photo mask are measured, the line widths of the respective resist patterns are corrected by adjusting the operating conditions of the exposure apparatus. However, if sizes and shapes of the patterns are changed, the operating conditions of the exposure apparatus must also be changed. Further, it is difficult to control the uniformity of the pattern line width because it is unclear how much uniformity can be improved due to malfunction of the exposure apparatus.

SUMMARY OF THE INVENTION

In one embodiment, the method for fabricating a photo mask includes forming first resist patterns over a transparent substrate on which a light blocking layer is formed and measuring line widths of the first resist patterns to define a defective pattern region having a line width larger than a desired critical dimension. The method also includes forming second resist patterns to expose the defective pattern region, and recessing the light blocking layer formed in the defective pattern region by a predetermined depth to undercut the first resist patterns. The method also includes removing the second resist patterns, etching the light blocking layer to form light blocking patterns, and removing the first resist patterns.

One of the first resist patterns and the second resist patterns may be formed using a negative resist layer, and the other may be formed using a positive resist layer. The first resist patterns may be exposed using an electron beam apparatus. The second resist patterns may be exposed using a stepper or a laser exposure apparatus. The light blocking layer may be recessed by over-etching using a plasma dry etch process. The step of etching the light blocking layer may include using a plasma dry etch process. After the step of removing the first resist patterns, the area of the transparent substrate where the light blocking patterns are formed may be cleaned.

In another embodiment, a method for fabricating a photo mask includes forming a light blocking layer and a phase shift layer over a transparent substrate, forming first resist patterns on the light blocking layer and the phase shift layer, and measuring line widths of the first resist patterns to define a defective pattern region having a line width larger than a desired critical dimension. The method also includes forming second resist patterns to expose the defective pattern region, recessing the light blocking layer formed in the defective pattern region by a predetermined depth to undercut the first resist patterns, and performing a selective etching process such that the second resist patterns remain in a light blocking region of the transparent substrate. The method further includes etching the light blocking layer to form light blocking patterns and etching the phase shift layer to form phase shift patterns in a main chip region of the transparent substrate. Still further, the method includes selectively etching the first resist patterns and the light blocking patterns exposed by the second resist patterns remaining in the light blocking region to expose the phase shift patterns in the main chip region, and removing the remaining second resist patterns and the remaining first resist patterns to expose the phase shift patterns and the light blocking patterns in the light blocking region.

One of the first resist patterns and the second resist patterns may be formed using a negative resist layer, and the other may be formed using a positive resist layer. The first resist patterns may be exposed using an electron beam apparatus. The second resist patterns may be exposed using a stepper or a laser exposure apparatus. The selective etching process may be performed by over-etching using a plasma dry etch process. The light blocking layer and the phase shift layer may be etched using a plasma dry etch process. The first resist patterns and the second resist patterns may have a sufficient thickness to remain in the light blocking region after the step of selectively etching the first resist patterns and the light blocking patterns. After removing the remaining first resist patterns, the transparent substrate where the light blocking patterns are formed may be cleaned.

Additional features of the disclosed invention may become apparent to those skilled in the art from a review of the following detailed description, taken in conjunction with the drawings and the appended claims.

DETAILED DESCRIPTION OF THE INVENTION

Hereinafter, exemplary embodiments of the present invention will be described with reference to accompanying drawings.

FIGS. 1 to 6 illustrate a method for fabricating a photo mask according to one embodiment of the invention.

Figure 1:
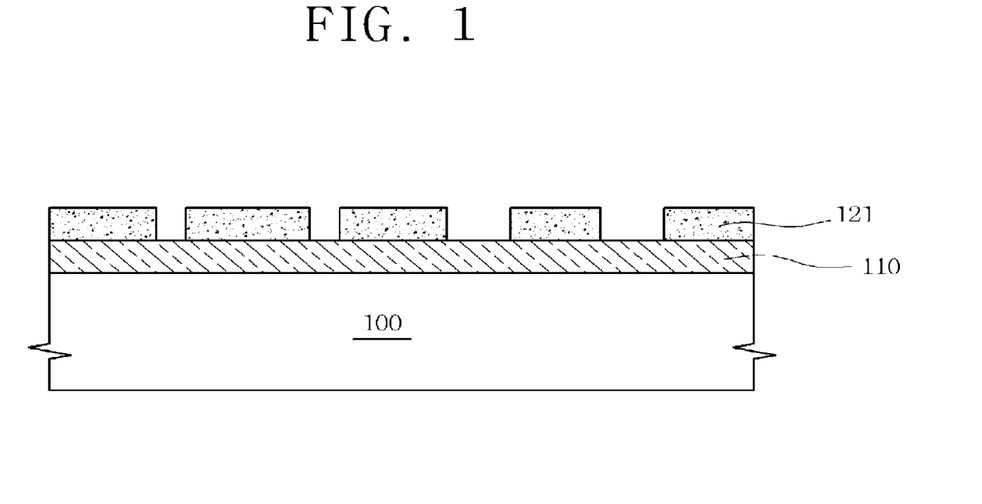
FIGS. 1 to 6 illustrate a method for fabricating a photo mask according to one embodiment of the invention.

Referring to FIG. 1, a light blocking layer 110 is formed on a transparent substrate 100, e.g., a quartz substrate. The light blocking layer 110 may be formed of a material capable of blocking transmitted light, such as, for example, chromium (Cr).

First resist patterns 121 are formed on the light blocking layer 110. More specifically, a first resist layer (not shown) is formed on the light blocking layer 110. Then, the first resist layer is exposed using an electron beam and developed to form the first resist patterns 121, thus selectively exposing portions of the light blocking layer 110. The first resist layer may be a negative resist layer. In this case, portions that are not irradiated by the electron beam are removed by a developer, while portions which are irradiated by the electron beam are not removed, that thereby forming the first resist patterns 121.

Defective resist patterns having line widths larger than a desired critical dimension (CD) may be formed due to various factors during the exposure and development processes. The defective resist patterns are used as an etch stop layer to determine the line width of light blocking patterns, which will be formed later. Therefore, the light blocking patterns may also have large line widths due to the defective resist patterns. As a result, the line width uniformity of the patterns in the semiconductor device may be degraded.

Figure 2:
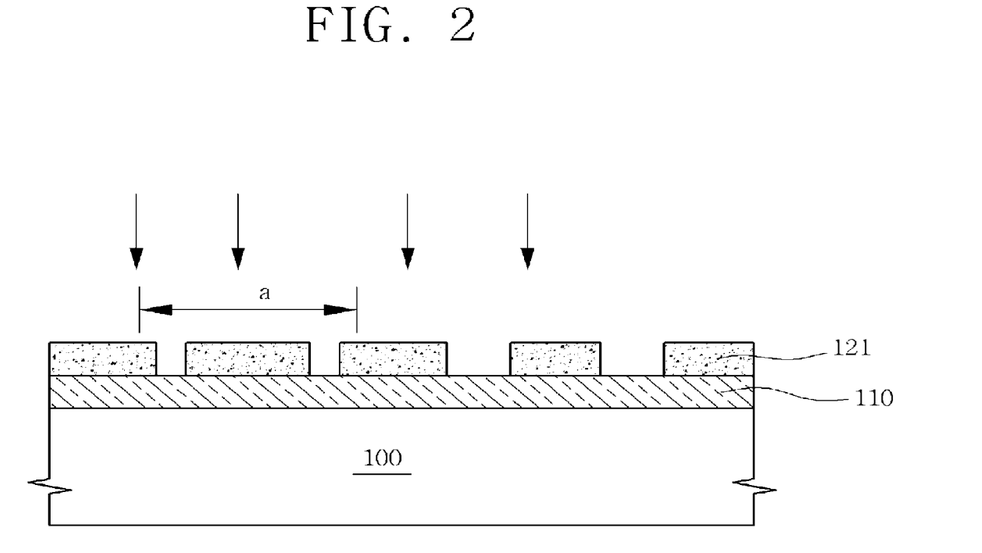

Referring to FIG. 2, line widths of the first resist patterns 121 are measured using a line width measuring device to define a region "a" in which the defective resist patterns are formed.

Figure 3:
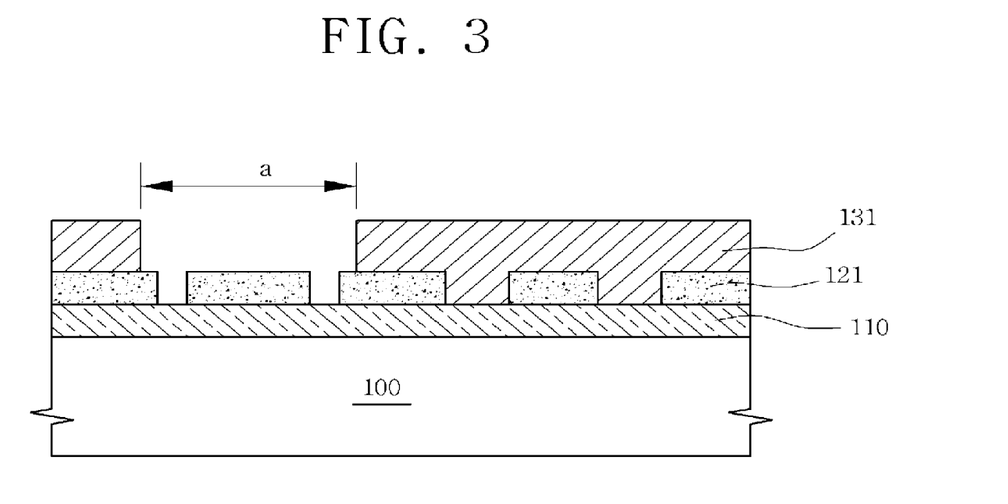

Referring to FIG. 3, second resist patterns 131 exposing the region "a" are formed on the first resist patterns 121.

More specifically, a second resist layer (not shown) is formed over the transparent substrate 100 where the first resist patterns 121 are formed. The second resist layer is exposed using a stepper for example, a Canon FPA 3000 EX3 Deep UV Stepper and developed to form the second resist patterns 131. The second resist layer may be exposed using a laser beam exposure apparatus. The second resist layer may be a positive resist layer. In some cases, the first resist layer may be a positive resist layer and the second resist layer may be a negative resist layer. Where the second resist layer is a positive resist layer, portions that are not irradiated by an exposure source are removed by a developer, while portions that are irradiated by the exposure source are not removed to thereby form the second resist patterns 131.

Therefore, only the region "a" in which the defective resist patterns having the large line widths are formed, can be selectively exposed without damage to the first resist patterns 121. In addition, the region in which the resist patterns already have the desired line widths can be protected during subsequent processes by the second resist patterns 131.

Figure 4:
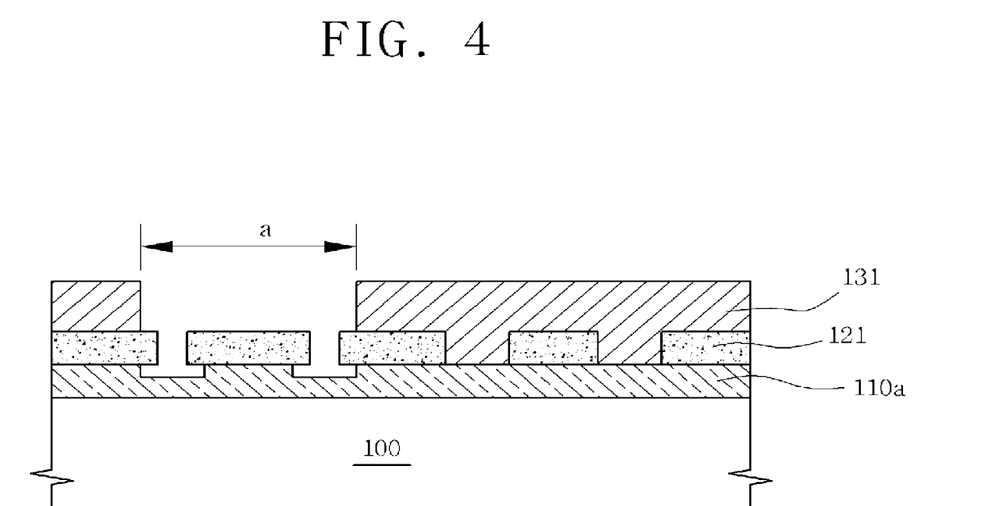

Referring to FIG. 4, the light blocking layer 110 formed in the region "a" is recessed by a predetermined depth to undercut the first resist patterns, for example by over-etching. The over-etch process may be performed using a plasma dry etch process. An etch profile is regulated such that the light blocking layer 110 has a line width smaller than the defective resist patterns having the large line width when the light blocking layer 110 is etched.

If the light blocking layer 110a is etched to have the line width relatively smaller than the first resist patterns 121 having the large line width, the light blocking layer 110a may be etched as illustrated in FIG. 4.

Figure 5:
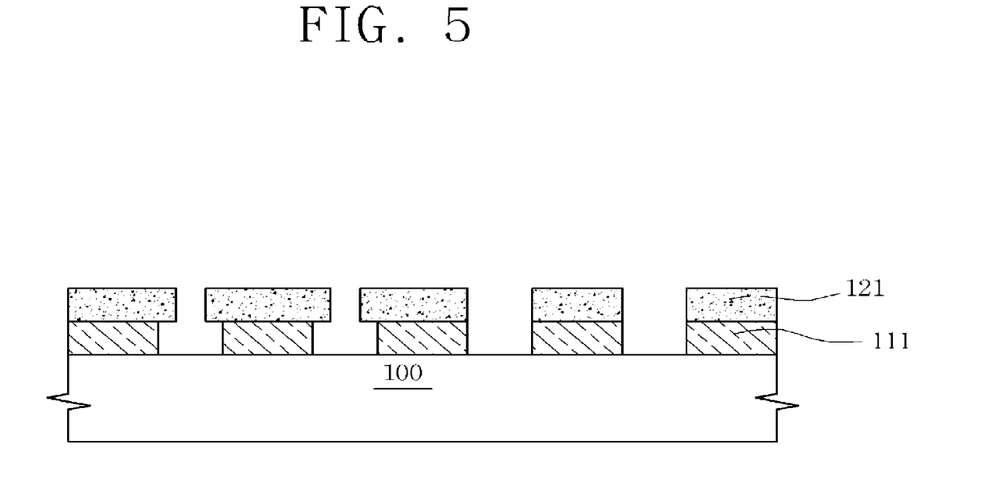

Referring to FIG. 5, the second resist patterns 131 are removed, and the light blocking layer 110a exposed by the first resist patterns is etched to form light blocking patterns 111 having the same line width, for example using a plasma dry etch process.

Figure 6:
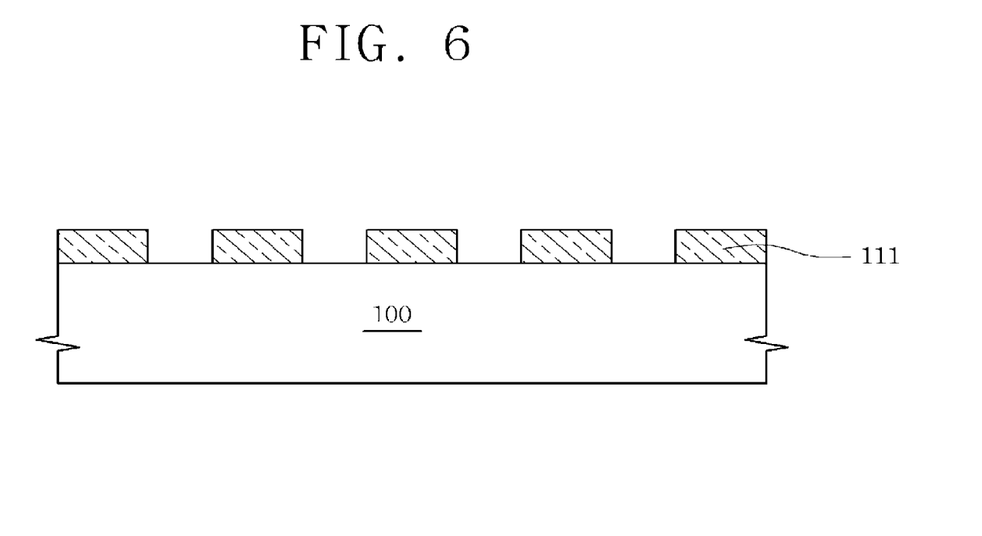

Referring to FIG. 6, the first resist patterns 121 are removed. In the region "a" where a line width correction is required, light blocking patterns 111 having a desired critical line width are formed by the light blocking layer 110a having a line width corrected by the over-etch process. In the region where the resist patterns 121 were originally formed with the desired line width, the light blocking layer 110a is etched using first resist patterns 121 as an etch mask to form the light blocking patterns 111 having the desired critical line width. After removing the first resist patterns 121, the area of the transparent substrate 100a where the light blocking patterns 111 are formed may be cleaned.

FIGS. 7 to 13 illustrate a method for fabricating a photo mask according to another embodiment of the invention.

Figure 7:
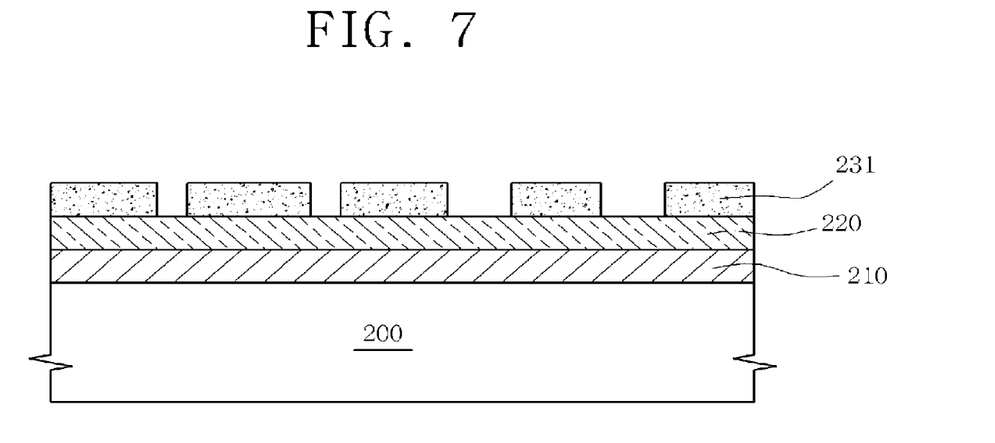
FIGS. 7 to 13 illustrate a method for fabricating a photo mask according to another embodiment of the invention.

Referring to FIG. 7, a phase shift layer 210 and a light blocking layer 220 are sequentially formed on a transparent substrate 200, e.g., a quartz substrate. The phase shift layer 210 may be formed of a material capable of shifting the phase of transmitted light. An example of such a material is molybdenum silicon nitride (MoSiN). The light blocking layer 220 may be formed of a material capable of blocking the transmitted light. An example of such a material is chromium (Cr).

First resist patterns 231 are formed on the light blocking layer 220. More specifically, a first resist layer (not shown) is formed on the light blocking layer 220. Then, the first resist layer is exposed using an electron beam and developed to form the first resist patterns 231, thus selectively exposing portions of the light blocking layer 220. The first resist layer may be a negative resist layer. In this case, portions that are not irradiated by the electron beam are removed by a developer, while portions that are irradiated by the electron beam are not removed, thereby forming the first resist patterns 231.

Defective resist patterns having line widths larger than a desired critical dimension (CD) may be formed due to various factors during the exposure and development processes. The defective resist patterns are used as an etch stop layer to determine the line widths of light blocking patterns and phase shift patterns, which will be formed later. Therefore, the light blocking patterns and the phase shift patterns may also have large line widths due to the defective resist patterns. As a result, the line width uniformity of the patterns in the semiconductor device may be degraded.

Figure 8:
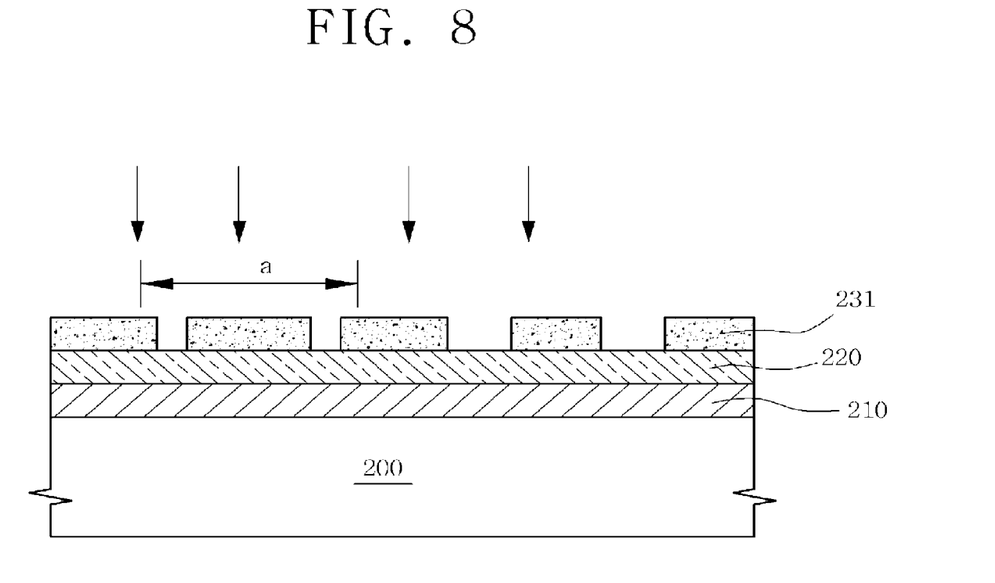

Referring to FIG. 8, line widths of the first resist patterns 231 are measured using a line width measuring device to define a region "a" in which the defective resist patterns are formed.

Figure 9:
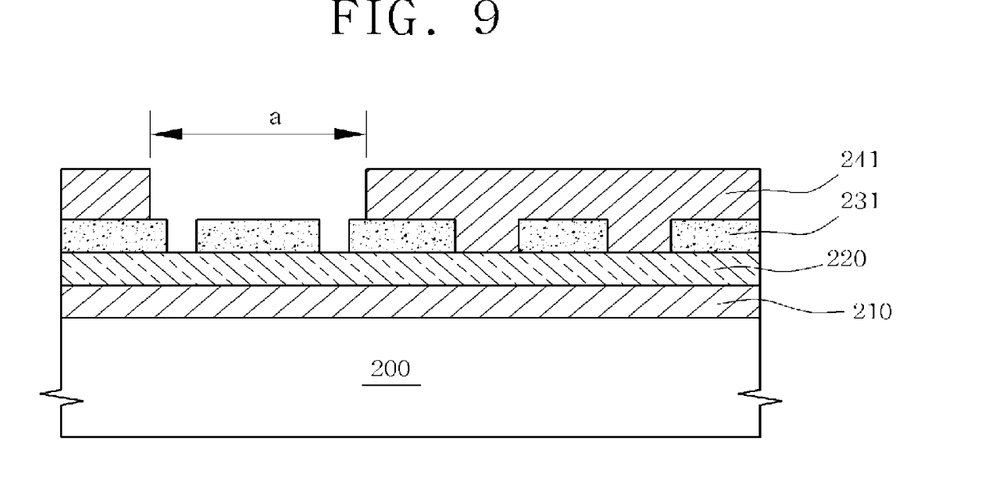

Referring to FIG. 9, second resist patterns 241 exposing the region "a" are formed on the first resist patterns 231.

More specifically, a second resist layer (not shown) is formed over the transparent substrate 200 where the first resist patterns 231 are formed. The second resist layer is exposed using a stepper for example, a Canon FPA 3000 EX3 Deep UV Stepper) and developed to form the second resist patterns 241. The second resist layer may be exposed using a laser beam exposure apparatus. The second resist layer may be a positive resist layer. In some cases, the first resist layer may be a positive resist layer and the second resist layer may be a negative resist layer. Where the second resist layer is a positive resist layer, portions that are not irradiated by an exposure source are removed by a developer, while portions that are irradiated by the exposure source are not removed to thereby form the second resist patterns 241.

Therefore, only the region "a" in which the defective resist patterns having the large line widths are formed, can be selectively exposed without damage to the first resist patterns 231. In addition, the region in which the resist patterns already have the desired line widths can be protected during subsequent processes by the second resist patterns 241.

Figure 10:
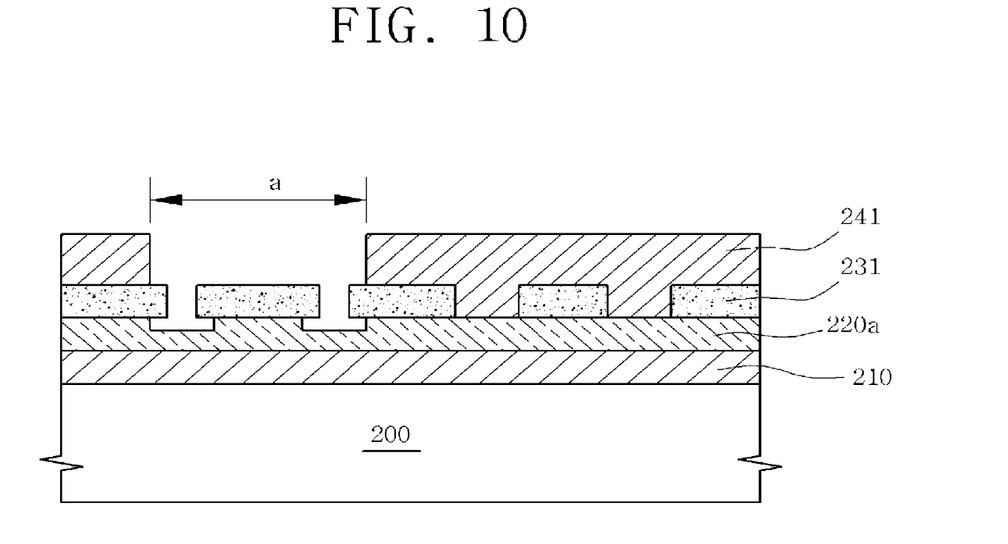

Referring to FIG. 10, the light blocking layer 220a formed in the region "a" is recessed by a predetermined depth to undercut the first resist patterns, for example by over-etching. The over-etch process may be performed using a plasma dry etch process. An etch profile is regulated such that the light blocking layer 220a has a line width smaller than the defective resist patterns having the large line width when the light blocking layer 220a is etched.

Figure 11:
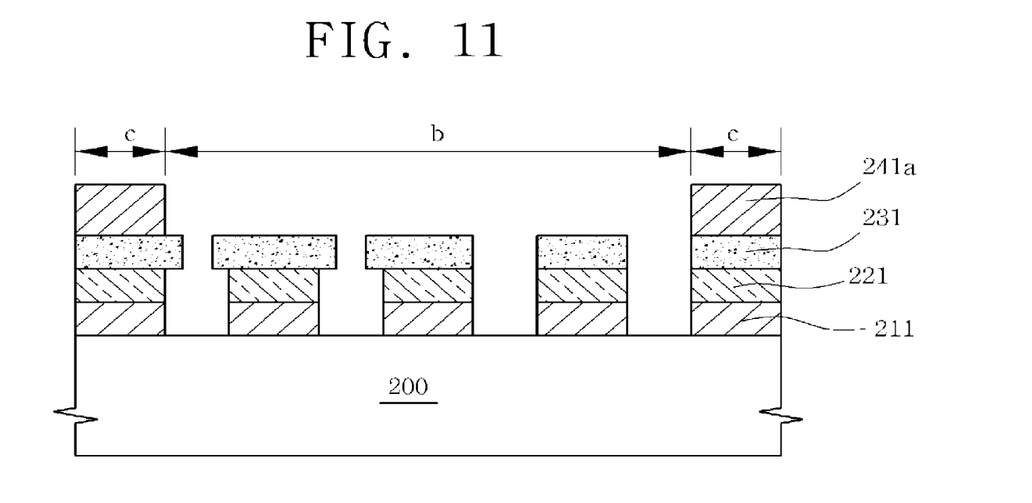

If the light blocking layer 220a is etched to have the line width relatively smaller than the first resist patterns 231 having the large line width, the light blocking layer 220a and the phase shift layer 210 may be etched as illustrated in FIG. 11.

Referring to FIG. 11, the second resist patterns 241a are selectively removed using the stepper. The use of the stepper makes it possible to remove the second resist patterns 241 formed in a middle region "b" in which the phase shift patterns 211 are formed, without any additional process. That is, edges of a photo mask, e.g., the second resist patterns 241a formed in frame regions "c" remain i.e., in a light blocking region, while the second resist patterns 241a formed in the middle region "b" are removed.

The phase shift patterns 211 and the light blocking patterns 221 can be formed on the frame regions "c" of the photo mask without additional resist coating process, exposure process, and development process, thereby simplifying the fabricating process.

The light blocking layer 220 and the phase shift layer 210 formed in the middle region "b" are etched to form the light blocking patterns 221 and the phase shift patterns 211, for example using a plasma dry etch process.

Portions of the light blocking layer 220a and the phase shift layer 210 are over-etched to form the light blocking patterns 221 and the phase shift patterns 211 having the corrected line width. Portions of the light blocking layer 220a and the phase shift layer 210 are etched using the first resist patterns 231 as an etch mask to form the light blocking patterns 221 and the phase shift patterns 211 having a desired critical dimension.

Figure 12:
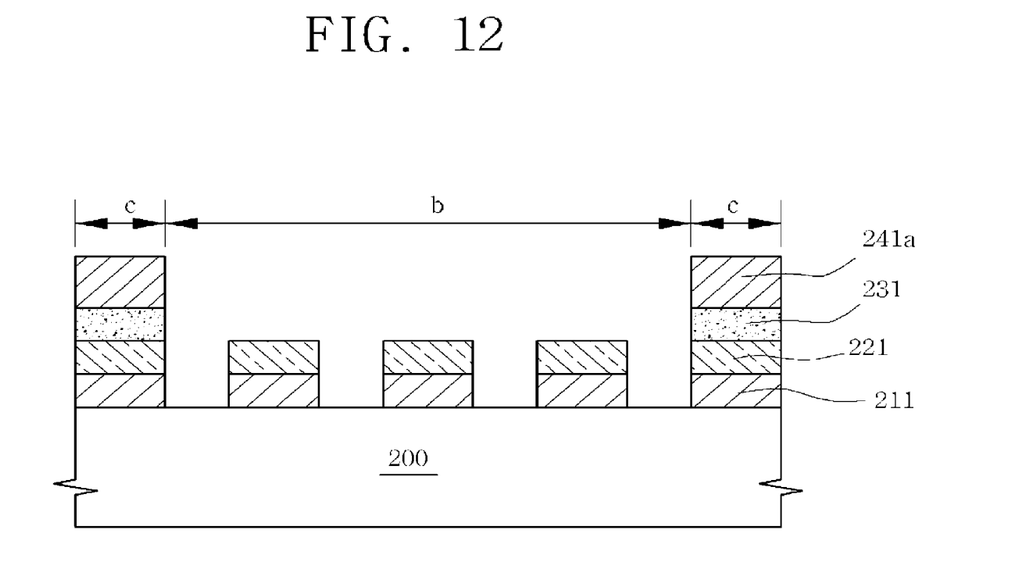
Figure 13:
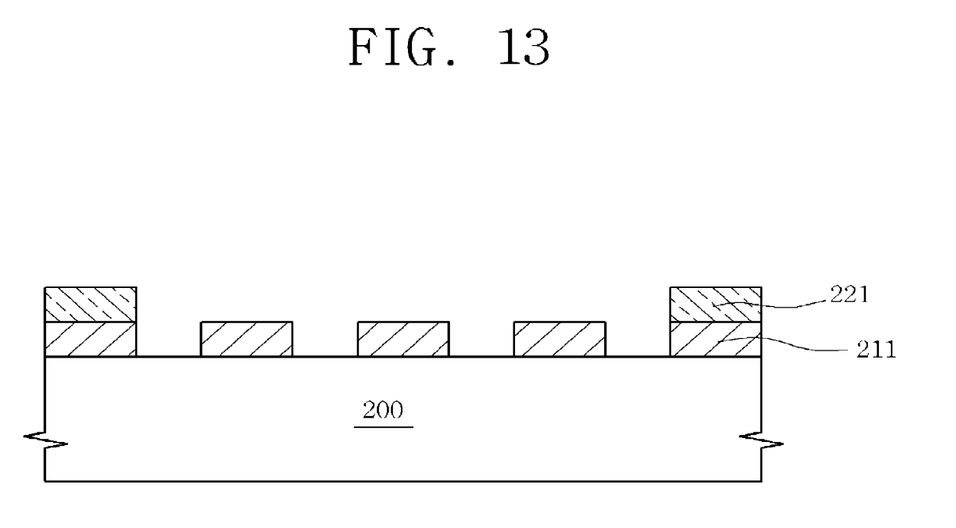

Referring to FIGS. 12 and 13, the first resist patterns 231 and the light blocking patterns 221 formed in the middle region "b" are removed, for example by etching. The first resist patterns 231 may be removed using oxygen plasma. Because the frame region "c" of the photo mask has a sufficient thickness due to the first resist layer and the second resist layer, the resist thicknesses of the frame regions "c" can be secured during the process of removing the first resist patterns 231 and the light blocking patterns 221 in the middle region "b" where the phase shift patterns are formed.

The first resist patterns 231 formed in the middle region "b" are removed. Then, the light blocking patterns 221 formed in the middle region "b" are removed using the resist layers remaining in the frame regions. Consequently, only the phase shift patterns 211 remain in the middle region "b".

Referring to FIG. 13, the first and second resist patterns 231 and 241 formed in the frame region "c" of the photo mask are removed to expose the phase shift patterns 211 and the light blocking patterns 221 in the frame region "c" of the photo mask. After removing the first resist patterns 231, the area of the transparent substrate 200 where the light blocking patterns 221 are formed may be cleaned.

By using the negative resist layer and the positive resist layer, only the phase shift patterns 211 can be formed in the middle region of the photo mask, and the light blocking patterns 221 and the phase shift patterns 211 can be formed in the frame region of the photo mask, without an additional resist coating process, an exposure process, and/or a development process.

Although preferred embodiments of the invention have been disclosed for illustrative purposes, those skilled in the art will appreciate that various modifications, additions and substitutions are possible, without departing from the scope and spirit of the invention as defined in the accompanying claims.

What is claimed is:

1. A method for fabricating a photo mask, the method comprising:
    forming first resist patterns over a transparent substrate on which a light blocking layer is formed;
    measuring line widths of the first resist patterns to define a defective pattern region having a line width of the first resist patterns larger than a desired critical dimension;
    forming second resist patterns to expose the defective pattern region and cover some of the first resist patterns;
    recessing a portion of the light blocking layer exposed by the first and second resist patterns in the defective pattern region to a predetermined depth to undercut the first resist patterns;
    removing the second resist patterns;
    etching the light blocking layer exposed by the first resist patterns to form light blocking patterns; and
    removing the first resist patterns.

2. The method of claim 1, comprising forming one of the first resist patterns and the second resist patterns using a negative resist layer and forming the other resist pattern using a positive resist layer.

3. The method of claim 1, comprising exposing the first resist patterns using an electron beam apparatus.

4. The method of claim 1, comprising exposing the second resist patterns using a stepper or a laser exposure apparatus.

5. The method of claim 1, wherein the step of recessing the light blocking layer comprises over-etching using a plasma dry etch process.

6. The method of claim 1, wherein the step of etching the light blocking layer comprises using a plasma dry etch process.

7. The method of claim 1, further comprising, after the step of removing the first resist patterns, cleaning the transparent substrate where the light blocking patterns are formed.

8. A method for fabricating a photo mask, the method comprising:
    forming a light blocking layer and a phase shift layer on a transparent substrate;
    forming first resist patterns over the light blocking layer and the phase shift layer;
    measuring line widths of the first resist patterns to define a defective pattern region having a line width of the first resist patterns larger than a desired critical dimension;
    forming second resist patterns to expose the defective pattern region and cover some of the first resist patterns;
    recessing a portion of the light blocking layer exposed by the first and second resist patterns in the defective pattern region to a predetermined depth to undercut the first resist patterns;
    performing a selective etching process such that the second resist patterns remain in a light blocking region of the transparent substrate;
    etching the light blocking layer exposed by the first resist patterns to form light blocking patterns and etching the phase shift layer to form phase shift patterns in a main chip region of the transparent substrate;
    selectively etching the first resist patterns and the light blocking patterns exposed by the second resist patterns remaining in the light blocking region to expose the phase shift patterns in the main chip region; and removing the remaining second resist patterns and the remaining first resist patterns to expose the phase shift patterns and the light blocking patterns in the light blocking region.

9. The method of claim 8, comprising forming one of the first resist patterns and the second resist patterns using a negative resist layer and forming the other resist pattern using a positive resist layer.

10. The method of claim 8, comprising exposing the first resist patterns using an electron beam apparatus.

11. The method of claim 8, comprising exposing the second resist patterns using a stepper or a laser exposure apparatus.

12. The method of claim 8, comprising performing the selective etching process by over-etching using a plasma dry etch process.

13. The method of claim 8, wherein the step of etching the light blocking layer and the phase shift layer comprises using a plasma dry etch process.

14. The method of claim 8, wherein the first resist patterns and the second resist patterns have a thickness sufficient to remain in the light blocking region after the step of selectively etching the first resist patterns and the light blocking patterns.

15. The method of claim 8 further comprising, after the step of removing the remaining first resist patterns, cleaning the transparent substrate where the light blocking patterns are formed.

* * * * *